[19] United States Patent
Simmons, III

[11] Patent Number: 5,516,875
[45] Date of Patent: May 14, 1996

[54] POSITIVE-WORKING PHOTODEFINABLE POLYIMIDE PRECURSORS

[75] Inventor: Howard E. Simmons, III, Wilmington, Del.

[73] Assignee: E. I. Du Pont de Nemours and Company, Wilmington, Del.

[21] Appl. No.: 356,761

[22] Filed: Dec. 15, 1994

Related U.S. Application Data

[62] Division of Ser. No. 145,351, Oct. 29, 1993, Pat. No. 5,399,655.

[51] Int. Cl.[6] .......................... C08G 73/10; C08G 8/02; C08L 79/08
[52] U.S. Cl. .......................... 528/128; 528/125; 528/172; 528/173; 528/174; 528/176; 528/183; 528/185; 528/188; 528/191; 528/192; 528/220; 528/229; 528/350; 528/353; 430/130; 430/135; 430/137; 524/600; 524/606; 524/715; 522/122; 522/154
[58] Field of Search ..................... 430/130, 135, 430/137, 270; 528/128, 125, 172–174, 176, 183, 185, 188, 191, 192, 220, 229, 350, 353; 522/122, 154; 524/600, 606, 715

[56] References Cited

U.S. PATENT DOCUMENTS 5,212,047  5/1993  Hertler et al. .......................... 430/270

FOREIGN PATENT DOCUMENTS 5-204154   8/1993  Japan .......................... G03F 7/038
WO93/09470 5/1993  WIPO .......................... G03F 7/022

OTHER PUBLICATIONS

Naitoh, K. et al., *Journal of Photopolymer Science & Technology*, 5, 339–342, 1992.

Shii, K. et al., *Polymer Preprints Japan*, 40, 3721, 1991.

*Primary Examiner*—James J. Seidleck
*Assistant Examiner*—Duc Truong

[57] ABSTRACT

This invention concerns positive-working photodefinable polyimide precursors which make use of chemical amplification based on photoacid catalyzed cleavage of acid labile-poly(amic acetal esters).

3 Claims, No Drawings

POSITIVE-WORKING PHOTODEFINABLE POLYIMIDE PRECURSORS

This is a division of application Ser. No. 08/145,351, filed Oct. 29, 1993, now U.S. Pat. No. 5,399,655.

FIELD OF THE INVENTION

This invention concerns positive-working photodefinable polyimide precursors which make use of chemical amplification based on photoacid catalyzed cleavage of acid labile poly(amic acetal esters).

TECHNICAL BACKGROUND

Photodefinable polyimides are coming into increased use in the manufacture of microelectronic devices, driven by the reduced number of processing steps necessary to pattern polyimide coatings. Applications include interlayer dielectrics on integrated circuits and for interconnects passivation layers, thermal and mechanical stress buffers in packaging, alpha particle barriers on memory devices, and ion implantation and dry etching masks.

Current commercial products include negative-working systems based on free-radical crosslinking of poly(amic methacrylate esters) or poly(amic methacrylate salts). Although these allow for deposition of relatively thick films, they must be solvent developed and suffer from large volume shrinkage (50%) upon imidization leading to sidewall distortion.

There is a need for positive-working offerings due to a number of potential benefits including greater processing ease, aqueous development, lower defect densities, and the ability to reexpose or rework.

K. Naitoh et al., Journal of Photopolymer Science and Technology 5, 339–342 (1992) and K. Ishii et al., Polymer Preprints Japan 40, 3721 (1991) disclose a photosensitive polyimide system comprising a polyimide resin containing a protected phenol group subject to acid catalyzed deprotection and a source of photogenerated acid. The phenol group is protected by the tetrahydropyranyl group. The protected phenol group is prepared by the reaction of a free phenol group with dihydropyran in the presence of p-toluenesulfonic acid. When this photosensitive polyimide system is exposed to light, acid is generated and, in the light-struck areas, the protected phenol is deprotected and subsequently washed away with a basic developer solution. The nonexposed areas are insoluble and remain behind. These nonexposed areas still contain the thermally-labile tetrahydropyranyl protected phenol.

U.S. Pat. No. 5,212,047 discloses resist compositions that include acid generators and polymers that possess recurring acid-labile groups including alpha alkoxyalkyl carboxylic acid esters and/or hydroxyaryl or hydroxyaralkyl esters of carboxylic acids.

WO 93/09470 describes positive-working photoresists containing a resin such as a polyimide precursor or a soluble polyimide, a photoactivable acid generator, and a solubility enhancer, capable of promoting dissolution of the photoactivated portion of the resist.

SUMMARY OF THE INVENTION

This invention provides acid-labile poly(amic acetal esters) (I)

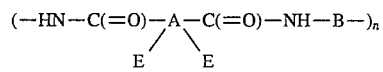

wherein the backbone polyamic acid portion of the poly(amic acetal ester) is derived from a tetracarboxylic acid dianhydride

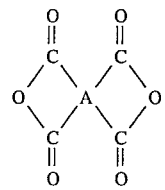

and a diamine $(B(NH_2)_2)$ and the acetal ester group (E) is of the formula

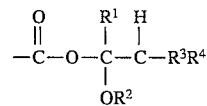

where $R^1$ is hydrogen or $C_1$–$C_6$ alkyl; $R^2$ is $C_1$–$C_{18}$ alkyl; and $R^3$ and $R^4$ independently are hydrogen or $C_1$–$C_{18}$ alkyl where the definition of $C_1$–$C_{18}$ alkyl includes the joining of $R^1$ and $R^2$ or $R^1$ and either $R^3$ or $R^4$, or $R^2$ and either $R^3$ or $R^4$ to form a 5-, 6-, or 7-membered ring and n is an integer from about 3 to about 90.

This invention further provides positive-working photodefinable polyimide precursors comprising an acid-labile poly(amic acetal ester) of the structure I and a source of photogenerated acid.

This invention further provides a process for the generation of a photodefined polyimide, which process comprises the steps of a) coating a solution of positive-working photodefinable polyimide precursor comprising an acid-labile poly(amic acetal ester) of the structure I and a source of photogenerated acid on a substrate, b) optionally, soft baking, c) exposing said optionally soft-baked, coated substrate to actinic radiation, d) post-exposure baking said exposed, coated substrate, e) developing the baked, exposed, coated substrate, and f) baking the developed coated substrate to effect thermal imidization and generate the photodefined polyimide.

DETAILED DESCRIPTION OF THE INVENTION

This invention provides acid-labile poly(amic acetal esters) (I)

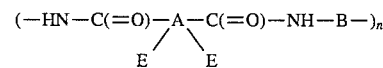

wherein the backbone polyamic acid portion of the poly(amic acetal ester) is derived from a tetracarboxylic acid dianhydride

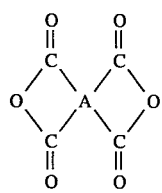

and a diamine (B(NH$_2$)$_2$) and the acetal ester group (E) is of the formula

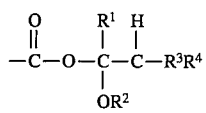

where R$^1$ is hydrogen or C$_1$–C$_6$ alkyl; R$^2$ is C$_1$–C$_{18}$ alkyl; and R$^3$ and R$^4$ independently are hydrogen or C$_1$–C$_{18}$ alkyl where the definition of C$_1$–C$_{18}$ alkyl includes the joining of R$^1$ and R$^2$ or R$^1$ and either R$^3$ or R$^4$, or R$^2$ and either R$^3$ or R$^4$ to form a 5-, 6-, or 7-membered ring and n is an integer from about 3 to about 90.

The tetracarboxylic acid dianhydride may be selected, for example, from 2,2'-bis-(3,4-dicarboxyphenyl)hexafluoropropane dianhydride (6 FDA), 4,4'-oxydiphthalic anhydride (ODPA), pyromellitic dianhydride, 1,4,5,8-naphthalenetetracarboxylic dianhydride, 2,3,6,7-naphthalenetetracarboxylic dianhydride, 3,3+,4,4'-biphenyltetracarboxylic dianhydride, 1,2,5,6-naphthalenetetracarboxylic dianhydride, 2,2'3,3'-biphenyltetracarboxylic dianhydride, 3,3',4,4'-benzophenonetetracarboxylic dianhydride, 2,2-bis(3,4-dicarboxyphenyl)propane dianhydride, bis(3,4-dicarboxyphenyl)sulfone dianhydride, 3,4,9,10-perylenetetracarboxylic dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, 9-trifluoromethyl-9-phenyl-2,3,6,7-xanthenetetracarboxylic dianhydride, 9,9-bis(trifluoromethyl)xanthenetetracarboxylic dianhydride, 12,14-(R)2-12,14-(Rf)2-12H,14H-5,7-dioxa-2,3,9,10-pentacenetetracarboxylic acid dianhydride (wherein R is selected from the group consisting of aryl, substituted aryl, and perfluoroalkyl, and Rf is perfluoroalkyl), and mixtures thereof.

The diamine may be selected, for example, from 4,4'-oxydianiline (ODA), 3,3'-diamino diphenyl sulfone (3,3'-DDS), 4,4'-diaminodiphenyl sulfone (4,4'-DDS) or 2,2-bis(4-[4-aminophenoxy]phenyl)sulfone (BAPS), 4,4'-diamino-3,3'-dimethylbiphenyl, 4,4'-diamino-3,3'-dimethoxybiphenyl, 4,4'bis(4 aminophenoxy)biphenyl, bis [4-(3-aminophenoxy)phenyl]sulfone, bis[4-(2-aminophenoxy)phenyl]sulfone, 1,4-bis(4-aminophenoxy)benzene, 4,4'-diamino-2,2'-dichloro-5,5'-dimethoxybiphenyl, 4,4'-diamino-2,2',5,5'-tetrachlorobiphenyl, 9,10-bis(4-aminophenyl)anthracene, o-tolidine sulfone, 1,3-bis(4-aminophenoxy)benzene, 1,3-bis(3-aminophenoxy)benzene, 1,4-bis(4-aminophenyl)benzene, [4-(4-aminophenoxy)phenyl]ether, bis(4-aminophenyl)methane, bis(4-amino-3-ethylphenyl)methane, bis(4-amino-3-methylphenyl)methane, bis(4-amino-3-chlorophenyl)methane, bis(4-aminophenyl)sulfide, bis(3-aminophenyl)ether, 3,4'diaminodiphenyl ether, 4,4'diaminooctafluorobiphenyl, 1,3-diaminobenzene, 2,2-bis[4-(4-aminophenoxy)phenyl]propane, 2,2-bis[4(4-aminophenoxy)phenyl]hexafluoropropane, 2,2-bis(4-aminophenyl)propane, 2,2-bis(4-aminophenyl)hexafluoropropane, 2,2-bis(4-amino-3-hydroxyphenyl)propane, 2,2-bis(4-amino-3-hydroxyphenyl)hexafluoropropane, 9,9-bis(4-aminophenyl)-10-hydroanthracene, diaminoanthraquinones (e.g., 1,5-diamino-9,10-anthraquinone and 2,6-diaminoanthraquinone), 4,4'-diamino-3,3'-dichlorobiphenyl, 4,4'-diamino-3,3'-dihydroxybiphenyl, 4,4'-diaminobiphenyl, 9,9-bis(4-aminophenyl)fluorene, bis(3-amino-4-methylphenyl)sulfone, 2-(4-aminobiphenyl)-2 -[3-(4-aminophenoxy)phenyl]propane, Bisaniline M, Bisaniline P, bis(4-amino-2,6-methylphenyl)methane, 2,4-diamino-1-isopropylbenzene, 1,4-diamino-2,5-dichlorobenzene, 1,4-diamino-2,6-dichlorobenzene, 1,4-diamino-2,5-dimethylbenzene, 1,4-diamino-2-chlorobenzene, 1,3-diamino-4-chlorobenzene, 1,4-diamino-5-chloro-2-methylbenzene, 6-aceto-2,4-diamino-1,3,5-triazine, 1,4-diamino-2,3,5,6-tetramethylbenzene, 1,3-diamino-2,4,6-trimethylbenzene, bis(3-aminopropyl)tetramethyldisiloxane, 2,7-diaminofluorene, 2,5-diaminopyridine, 1,4-diaminobenzene, 1,2-bis(4-aminophenyl)ethane, 4,4'-diaminobenzanilide, 4-aminophenyl-4-aminobenzoate, 1,5-diaminonaphthalene, 2,4-diaminotoluene, 1,3-diamino-5-trifluoromethylbenzene, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, 1,4-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-3-trifluoromethylphenoxy)diphenyl sulfone, 2,2-bis[4-(4-amino-3-trifluoromethylphenoxy)phenyl]
hexafluoropropane, 4,4-diamino-3,3',5,5'-tetramethylbiphenyl, 4,4'-diamino-2,2'-bis(trifluoromethyl)biphenyl, 4,4'-diamino-2,2'-dimethylbiphenyl, 4,4'-diamino-3,3'-dimethylhexafluorobiphenyl, 4,4'''-diaminoquaterphenyl, 1,3-diamino-5-tert-butylbenzene, 1,4-bis(3-aminophenoxy)benzene, bis[4-(3-aminophenyl)phenyl]ether, 4,4'-diamino-2,2'-dichlorobiphenyl, 3,3'-diamino-4,4'-dihydroxybiphenyl, and mixtures thereof.

The combination of dianhydride and diamine must be selected such that the resulting acid-labile poly(amic acetal ester) is soluble in the selected non-basic reaction solvent.

The acetal ester group (E) of the structure shown above is derived from the reaction of a carboxylic acid with vinyl ethers such as dihydropyran (DHP), vinyl ethyl ether (VEE), 2-methoxypropene (2MP, methyl 2-propenyl ether) or vinyl isobutyl ether (VIBE).

Reaction Scheme I (below), labelled Polymer Synthesis, shows a synthetic scheme for the preparation of a preferred acid-labile poly(amic acetal ester) from 6FDA, ODA and DHP.

The poly(amic acids) are first synthesized in non-basic solvents such as THF, diglyme or other similar ethereal solvents, gamma-butyrolactone, or DMSO. Direct esterification of the polymer with up to 90–95% conversion is affected by addition of excess vinyl ether (for example, dihydropyran) with heating. The poly(amic acetal esters) can be isolated and reformulated as desired, or used as prepared in solution. With gammma-butyrolactone reaction solvent, photoacid generator can be added and the crude reaction mixture used directly as coating solution.

Polymer Synthesis

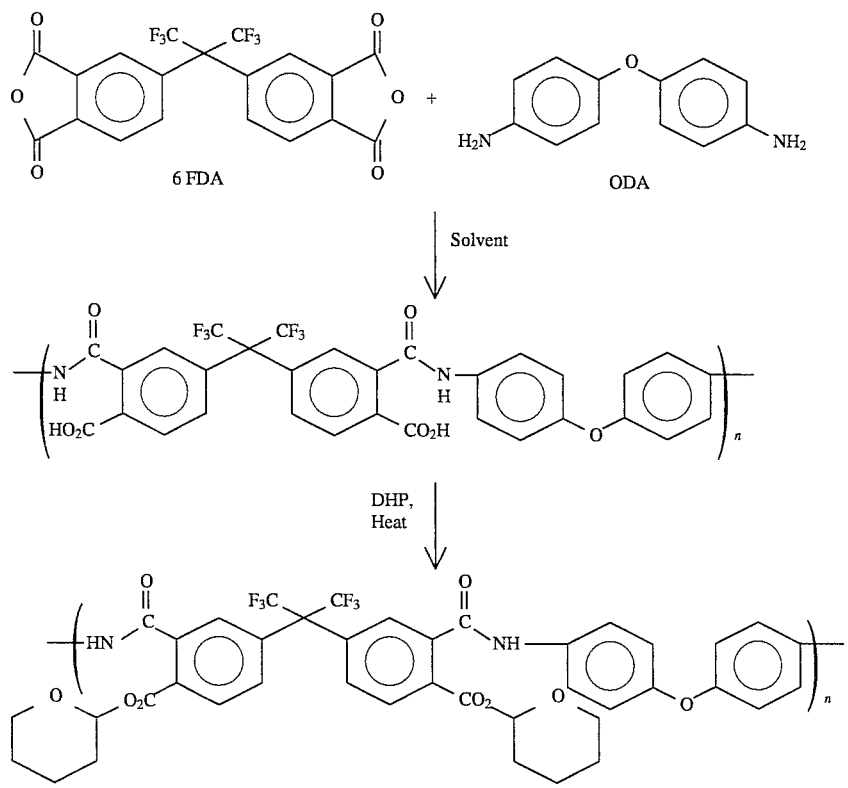

Scheme 1

This invention further provides positive-working photodefinable polyimide precursors comprising an acid-labile poly(amic acetal ester) of the structure I and a source of photogenerated acid. The source of photogenerated acid is a compound that, upon exposure to actinic rediation, generates an acid. Suitable sources of photogenerated acid include 3-(9-anthracenyl)propyldiphenylsulfonium hexafluoroantimonate and other iodonium, sulfonium, and phosphonium salts, optionally in the presence of a dye sensitizer. The source of photogenerated acid, optionally sensitized, is selected such that it absorbs actinic radiation at a wavelength different from (typically longer wavelength) the polymer backbone.

This invention further provides a process for the generation of a photodefined polyimide, which process comprises the steps of a) coating a solution of positive-working photodefinable polyimide precursors comprising an acid-labile poly(amic acetal ester) of the structure I and a source of photogenerated acid on a substrate, b) optionally, soft baking, c) exposing said optionally soft-baked, coated substrate to actinic radiation, d) post exposure baking said exposed, coated substrate, e) developing the baked, exposed, coated substrate, and f) baking the developed coated substrate to effect thermal imidization and generate the photodefined polyimide.

The coating is optimally carried out by spin coating a solution of the positive-working photodefinable polyimide precursor, typically to a thickness of about 1 to about 20 microns. Other coating methods such as dipping or spraying may be employed.

The prebake or soft bake is carried out at temperatures of approximately 50° C. to 110° C. to remove substantially all of the solvent.

The actinic radiation employed is preferably of wavelength 365 nanometers (the I line) and/or 436 nanometers (the G line). Total exposure is preferably 200–2000 mJ/cm$^2$.

Post-exposure baking is carried out to allow photoacid migration and catalytic cleavage of the acetal ester groups to free carboxylic acid groups.

The system can be developed in dilute aqueous base, i.e., dilute aqueous potassium carbonate or tetramethylammonium hydroxide, usually by spraying or dipping. Actinic radiation struck areas are selectively removed.

Final baking, or imidization is carried out at 200° C.–450° C., preferably 200° C.–250° C. During baking, imidization weight loss from these polymers is 20–40% which offers improved wall distortion versus prior art systems.

EXAMPLES

Example 1

Synthesis of 6FDA/ODA/DHP (Polymer (Solution)

Under nitrogen, 18.00 g of ODA (fw 200.2, 90 mmoles) and 120.0 g of γ-butyrolactone was placed inside a resin kettle flask and stirred until all of the solids were in solution. Attached a nitrogen bubbler, a dropping funnel, and a high torque mechanical stirrer. Next added 39.96 g of 6FDA (fw 444.2, 90 moles). As all of the solids went into solution with stirring, the mixture became very viscous over a period of 30 minutes. The reaction was stirred for a total of 4 hours. Then with stirring, added dropwise 60.6 g of 3,4-dihydro-2H-pyran (fw 84.12, 720 mmoles, 8 equivalents) slowly over a period of 45 minutes. The stirring rate was increased and the reaction was stirred and heated at 45° C. overnight. The next day a small aliquot was removed and added to a beaker containing 200 mL of stirred methanol. A golden polymer precipitate formed which was quickly vacuum filtered under dry conditions, washed with hexane, and dried under vacuum. $^1$H NMR showed that the reaction was essentially complete. The reaction mixture was then transfered to a jar and stored under nitrogen. This total reaction mixture contained 30.65% solids. GPC analysis showed $M_w$=12000, $M_n$=6330, and $M_w/M_n$=1.89.

Example 2

Synthesis of 6FDA/ODA/VIBE Polymer

Under nitrogen, inside a three-necked flask, placed 2.00 g of 4-aminophenyl ether (ODA, fw 200.3, 10.0 mmoles) and 40.0 mL of anhydrous THF. The diamine went into solution while stirring with a mechanical stirrer. Next added 4.44 g of 6FDA (fw 444.2, 10.5 mmoles). Everything went into solution within 5 minutes. After 5 hours with stirring at room temperature, added 16.0 g of vinyl isobutylether (VIBE, fw 100.16, 0.160 moles) and 0.2 g of pyr-HCl (polymer supported pyridinium hydrochloride) polymer. The reaction was heated for 60 hours at 35° C. under nitrogen with stirring. $^1$H NMR of the crude reaction indicated 93% conversion to the acetal ester. The catalyst was filtered off and the filtrate was added dropwise to a stirring blender containing 500 mL of hexane. The white precipitate was filtered, dried under high vacuum to give 6.93 g of product. GPC analysis showed $M_w$=8220, $M_n$=4440, and $M_w/M_n$=1.85. $^1$H NMR of the isolated product now indicated 75% conversion to the acetal ester.

Example 3

Synthesis of 6FDA/ODA/2MP Polymer

Under nitrogen, inside a three-necked flask, placed 2.00 g of 4-aminophenyl ether (ODA, fw 200.3, 10.0 mmoles) and 40.0 mL of anhydrous THF. The diamine went into solution while stirring with a mechanical stirrer. Next added 4.44 g of 6FDA (fw 444.2, 10.5 mmoles). Everything went into solution within 5 minutes. After 5 hours stirring at room temperature, added 16.0 g of 2-methoxy propene (2MP, fw 72.11, 0.222 moles) and 0.2 g of pyr-HCl polymer. The reaction was heated for 60 hours at 35° C. under nitrogen with stirring. The catalyst was filtered off and the filtrate was added dropwise to a stirring blender containing 500 mL of hexane. The white precipitate was filtered, dried under high vacuum, to give 5.63 g of product. GPC analysis showed $M_w$=7950, $M_n$=4330, $M_w/M_n$=1.84.

Example 4

Synthesis of 6FDA/ODA/VEE

Under nitrogen inside a resin kettle, placed 2.00 g of 4-aminophenyl ether (ODA, fw 200.3, 10.0 mmoles) and 40.0 mL of anhydrous THF. The diamine went into solution while stirring with a high torque mechanical stirrer. Next added 4.66 g of 6FDA (fw 444.2, 10.5 mmoles). Everything went into solution within 5 minutes. After 5 hours of stirring at room temperature, added 32.0 g of vinyl ethyl-ether (VEE) and 0.2 g of pyr-HCl polymer. The reaction was heated for 60 hours at 50° C. under nitrogen with stirring. $^1$H NMR showed good conversion to the acetal ester. The catalyst was filtered off and the filtrate was added dropwise to a stirring blender containing 500 mL of hexane. The white precipitate was filtered, dried under high vacuum to give the product. GPC analysis showed $M_w$=7180, $M_n$=3930, and $M_w/M_n$=1.83.

Example 5

Synthesis of 6FDA/4,4'-DDS/DHP Polymer

Under nitrogen inside a resin kettle, placed 2.48 g of 4,4'-DDS (fw 248.3, 10.0 mmoles) and 40.0 mL of anhydrous THF. The diamine did not go into solution. While stirring with a high-torque mechanical stirrer, added 4.66 g of 6FDA (fw 444.2, 10.5 mmoles) and 10.0 mL more THF. Everything went into solution within 5 minutes. After 2 hours of stirring at room temperature added 16.0 g of dihydropyran and 0.2 g of pyr-HCl polymer. The reaction was then stirred for 60 hours at 35° C. under nitrogen with stirring. $^1$H NMR of crude reaction product shows 90+% conversion to the acetal ester. The catalyst was filtered off and the filtrate was added dropwise to a stirring blender containing 500 mL of hexane. The white precipitate was filtered, washed with hexane, dried under high vacuum to give 6.52 g of product. GPC analysis showed $M_w$=4730, $M_n$=2380, and $M_w/M_n$=1.99.

Example 6

Photolithographic Evaluation of 6FDA/ODA/DHP Polymer Solution

Inside an amber bottle, 0.413 g of the photoacid generator 3-(9-anthracenyl)propyldiphenylsulfonium hexafluoroantimonate (9% solids by weight) was dissolved in 15.0 g of the ODA/6FDA/DHP γ-butyrolactone reaction mixture from Example 1. After passage through a 0.45 micron Uniflo plus® syringe filter, the 32.5 weight percent solution was ready for spin coating and imaging.

The following are the conditions used to photoimage a polyimide film on a silicon wafer:

| Equipment | Vendor/Model |
|---|---|
| Spin Coater | Silicon Valley Group 8626 Photoresist Coater |
| Developer | Silicon Valley Group 8632 CTD Constant Temperature Developer |
| Oven | VWR Scientific 1610 Horizontal Airflow Cleanroom Oven |
| Thickness | Tencor-Alpha-Step 200 Computerized Profiler |
| Exposure Unit | Oriel Ultraviolet Illumination System 87350 (350–450 nm bandwidth) Arc Lamp Power Supply 68810 Intensity Controller 68850 Substrate Stage 83210 Shutter Timer 84350 |

A 0.1% solution (50/50 solution in water/isopropanol) of VM651 DuPont Adhesion Promoter was first applied to the wafer by flooding, then spinning at 4000 rpm for 1 minute. Approximately 1.5 mL of the polyimide solution was then applied to the center of the wafer and spun off at 3000 rpm for 60 seconds. After a 55° C. soft bake for 10 minutes, the thickness of the unexposed film was determined to be 6.4 microns. The wafer was exposed using an Opto-Line Density Gradient Photomask for 120 seconds (2080 mJ/cm$^2$ at 365 nm). After a post-exposure bake at 95° C. for 20 minutes, the wafer was developed at 45° C. for 4 minutes at 500 rpm. The developer solution was a 2.38% solution of TMAH (tetramethylammonium hydroxide)[NSD-TD, Tokyo Ohka America]. After a water wash at 1000 rpm for 20 seconds, the wafer was dried at 4000 rpm for 20 seconds. Resolution was better than 10 micron lines/spaces in a 5.7 micron thick developed film. Thermal imidization was affected by oven treatment at 250° C. overnight. Measured film thickness after imidization was 4.1 microns (72% retention).

Clear times of polyimide films in exposed areas were predetermined to be 180 seconds for a 6.4 micron film. Under the same conditions, the unexposed areas decreased to 5.7 microns or 88.7% retention of the resist.

What is claimed is:

1. A process for the generation of a photodefined polyimide, comprising the steps:

a) coating a solution of positive-working photodefinable polyimide precursor comprising an acid-labile poly(amic acetal ester) of the following structure

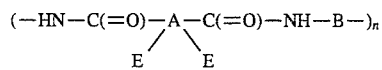

and a source of photogenerated acid on a substrate, wherein the backbone polyamic acid portion of the poly(amic acetal ester) is derived from a tetracarboxylic acid dianhydride of the structure

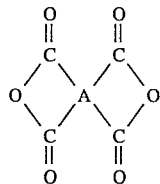

and a diamine of the structure $B(NH_2)_2$ wherein A is a tetravalent aromatic moiety and B is a divalent aromatic moiety and the acetal ester group (E) is of the formula

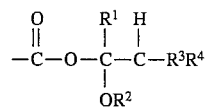

where $R^1$ is hydrogen or $C_1$–$C_6$ alkyl; $R^2$ is $C_1$–$C_{18}$ alkyl; and $R^3$ and $R^4$ independently are hydrogen or $C_1$–$C_{18}$ alkyl where the definition of $C_1$–$C_{18}$ alkyl includes the joining of $R^1$ and $R^2$ or $R^1$ and either $R^3$ or $R^4$, or $R^2$ and either $R^3$ or $R^4$ to form a 5-, 6-, or 7-membered ring and n is an integer from about 3 to about 90, b) optionally, soft baking, c) exposing said optionally soft-baked, coated substrate to actinic radiation, d) post exposure baking said exposed, coated substrate, e) developing the baked, exposed, coated substrate, and f) baking the developed coated substrate to effect thermal imidization and generate the photodefined polyimide.

2. The process of claim 1 wherein the source of photogenerated acid is selected from the group consisting of iodonium, sulfonium, and phosphonium salts, optionally in the presence of a dye sensitizer.

3. The process of claim 2 wherein the source of photogenerated acid is 3-(9-anthracenyl)propyldiphenylsulfonium hexafluoroantimonate.

* * * * *